(12) United States Patent
Hanaoka

(10) Patent No.: US 6,897,127 B2
(45) Date of Patent: May 24, 2005

(54) SEMICONDUCTOR DEVICE, METHOD OF MANUFACTURING THE SAME, CIRCUIT BOARD, AND ELECTRONIC INSTRUMENT

(75) Inventor: Terunao Hanaoka, Suwa (JP)

(73) Assignee: Seiko Epson Corporation, Tokyo (JP)

(*) Notice: Subject to any disclaimer, the term of this patent is extended or adjusted under 35 U.S.C. 154(b) by 78 days.

(21) Appl. No.: 10/654,449

(22) Filed: Sep. 4, 2003

(65) Prior Publication Data

US 2004/0102024 A1 May 27, 2004

(30) Foreign Application Priority Data

Oct. 15, 2002 (JP) ........................................ 2002-300262

(51) Int. Cl.⁷ .............................................. H01L 21/46
(52) U.S. Cl. ....................... 438/460; 438/461; 438/462; 438/463; 438/113; 438/33
(58) Field of Search ................................ 438/460–465, 438/113, 33

(56) References Cited

U.S. PATENT DOCUMENTS 6,633,081 B2 * 10/2003 Sahara et al. ............... 257/738

FOREIGN PATENT DOCUMENTS

JP          A 11-297873        10/1999

OTHER PUBLICATIONS

U.S. Appl. No. 10/667,331, filed Sep. 23, 2003, Hanaoka

U.S. Appl. No. 10/679,467, filed Oct. 7, 2003, Hanaoka.

U.S. Appl. No. 09/700,464, filed Nov. 15, 2000, Hanaoka et al.

* cited by examiner

Primary Examiner—Dung A. Le
(74) Attorney, Agent, or Firm—Oliff & Berridge, PLC

(57) ABSTRACT

A wiring pattern is formed over a semiconductor wafer, and an external terminal is formed on the wiring pattern. The wiring pattern extends from a pad which is part of an interconnect to an integrated circuit formed in the semiconductor wafer. A non-resin layer of a non-resin material is formed in a first region of the semiconductor wafer. A resin layer is formed in a second region which is a region of the semiconductor wafer other than the first region by utilizing the non-resin layer. The semiconductor wafer is cut long the first region.

20 Claims, 8 Drawing Sheets

SEMICONDUCTOR DEVICE, METHOD OF MANUFACTURING THE SAME, CIRCUIT BOARD, AND ELECTRONIC INSTRUMENT

Japanese Patent Application No. 2002-300262 filed on Oct. 15, 2002, is hereby incorporated by reference in its entirety.

BACKGROUND OF THE INVENTION

The present invention relates to a semiconductor device, a method of manufacturing the same, a circuit board, and an electronic instrument.

Bare chip mounting is ideal in order to enable high density mounting of a semiconductor device. However, a guarantee of quality and handling of the bare chip are difficult. Therefore, a semiconductor device to which a chip scale/size package (CSP) is applied has been developed. In particular, a wafer level CSP which is manufactured at the wafer level has attracted attention in recent years. In the wafer level CSP, a wiring pattern and external terminals (solder ball, for example) are formed on a semiconductor wafer, and a plurality of semiconductor devices are formed by dicing the semiconductor wafer. There may be a case where a resin layer is formed to reinforce the base of the external terminals. In this case, since the resin layer is also diced when dicing the semiconductor wafer, clogging of a dicing blade occurs. Therefore, it is difficult to dice the semiconductor wafer so as to prevent breakage of the edge of the semiconductor chip. If the edge of the semiconductor chip breaks, reliability of the semiconductor device is decreased.

BRIEF SUMMARY OF THE INVENTION

According to one aspect of the present invention, there is provided a method of manufacturing a semiconductor device comprising:

forming a wiring pattern over a semiconductor wafer and forming an external terminal on the wiring pattern, the wiring pattern extending from a pad which is part of an interconnect to an integrated circuit formed in the semiconductor wafer;

forming a non-resin layer of a non-resin material in a first region of the semiconductor wafer;

forming a resin layer in a second region which is a region of the semiconductor wafer other than the first region by utilizing the non-resin layer; and cutting the semiconductor wafer along the first region.

According to another aspect of the present invention, there is provided a semiconductor device manufactured by the above method.

According to further aspect of the present invention, there is provided a circuit board on which is mounted the above semiconductor device.

According to yet another aspect of the present invention, there is provided an electronic instrument comprising the above semiconductor device.

DETAILED DESCRIPTION OF THE EMBODIMENT

Figure 1A:
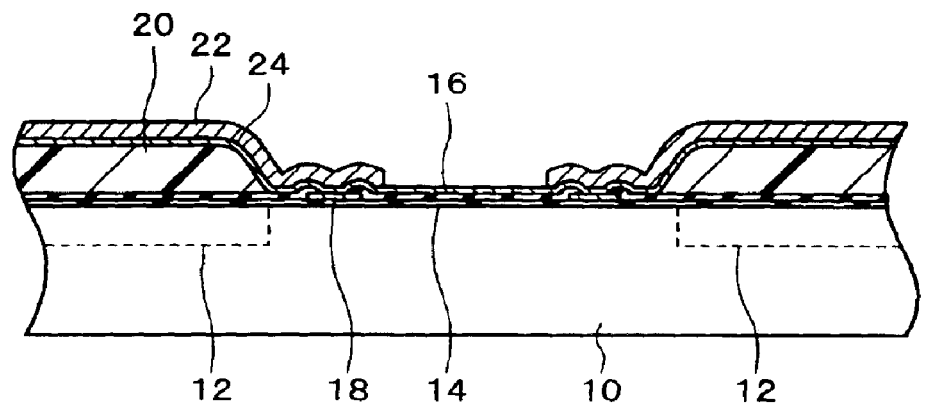
FIGS. 1A to 1C are diagrams for illustrating a method of manufacturing a semiconductor device according to a first embodiment of the present invention.

An objective of the present invention is to prevent a decrease in reliability relating to a semiconductor device, a method of manufacturing the semiconductor device, a circuit board, and an electronic instrument.

(1) According to one embodiment of the present invention, there is provided a method of manufacturing a semiconductor device comprising:

forming a wiring pattern over a semiconductor wafer and forming an external terminal on the wiring pattern, the wiring pattern extending from a pad which is part of an interconnect to an integrated circuit formed in the semiconductor wafer;

forming a non-resin layer of a non-resin material in a first region of the semiconductor wafer;

forming a resin layer in a second region which is a region of the semiconductor wafer other than the first region by utilizing the non-resin layer; and cutting the semiconductor wafer along the first region.

In this embodiment, since the resin layer is not formed in the first region along which the semiconductor wafer is cut, the semiconductor wafer can be smoothly cut. This prevents a decrease in reliability.

(2) In this method of manufacturing a semiconductor device, the non-resin layer may be formed of a material having a different etching rate from a material of the resin layer in the formation of the non-resin layer.

(3) This method of manufacturing a semiconductor device may further comprise etching the non-resin layer after the formation of the resin layer and before the cutting of the semiconductor wafer, wherein the non-resin layer is formed of a material having a higher etching rate in the etching of the non-resin layer than a material of the resin layer in the formation of the non-resin layer.

(4) In this method of manufacturing a semiconductor device, the non-resin layer may be formed of a material having a lower spreading property than a material of the resin layer in the formation of the non-resin layer.

(5) In this method of manufacturing a semiconductor device, the semiconductor wafer may be cut after removing the non-resin layer.

(6) In this method of manufacturing a semiconductor device, the non-resin layer may be cut together with the semiconductor wafer.

(7) In this method of manufacturing a semiconductor device, the non-resin layer may be formed of a metal.

(8) In this method of manufacturing a semiconductor device, the non-resin layer may be formed by plating.

(9) This method of manufacturing a semiconductor device may further comprise: forming the resin layer to cover the non-resin layer; and removing at least part of the resin layer located over the non-resin layer before cutting the semiconductor wafer.

The resin layer is once formed above the first region, but that portion is removed before cutting the semiconductor wafer.

(10) This method of manufacturing a semiconductor device may further comprise: forming the resin layer to cover the external terminal; and removing at least part of the resin layer located over the external terminal.

(11) In this method of manufacturing a semiconductor device, the removal of at least part of the resin layer located over the non-resin layer and the removal of at least part of the resin layer located over the external terminal may be simultaneously performed.

(12) In this method of manufacturing a semiconductor device, an insulating layer may be formed over the semiconductor wafer, and the wiring pattern may be formed over the insulating layer.

(13) In this method of manufacturing a semiconductor device, the non-resin layer may be formed to be higher than the insulating layer.

(14) In this method of manufacturing a semiconductor device, the insulating layer may be formed to avoid the first region.

(15) This method of manufacturing a semiconductor device may further comprise forming a solder resist layer so as to cover the wiring pattern excluding a region in which the external terminal is formed, before forming the resin layer.

(16) In this method of manufacturing a semiconductor device, the solder resist layer may be formed to avoid the first region.

(17) According to another embodiment of the present invention, there is provided a semiconductor device manufactured by the above method.

(18) According to further embodiment of the present invention, there is provided a circuit board on which is mounted the above semiconductor device.

(19) According to yet another embodiment of the present invention, there is provided an electronic instrument comprising the above semiconductor device.

The embodiments of the present invention are described below with reference to the drawings. However, the present invention is not limited to the following embodiments.

First Embodiment

FIGS. 1A to 6 are diagrams for illustrating a method of manufacturing a semiconductor device according to a first embodiment of the present invention. In this embodiment, a semiconductor wafer 10 (see FIG. 6) is used. As shown in FIG. 1A, an integrated circuit 12 is formed in the semiconductor wafer 10. In the case of cutting the semiconductor wafer 10 into a plurality of semiconductor chips, a plurality of the integrated circuits 12 are formed in the semiconductor wafer 10, and each of the semiconductor chips includes one of the integrated circuit 12.

One or more passivation films 14 and 16 may be formed on the surface of the semiconductor wafer 10. The passivation film 16 may be formed of a polyimide resin or the like on the passivation film 14 formed of $SiO_2$, SiN, or the like, for example.

A pad 18 is formed on the semiconductor wafer 10. The pad 18 is a part (or an end section) of an interconnect which is electrically connected to the integrated circuit (or a semiconductor integrated circuit, for example) 12. The passivation film 16 is formed to avoid at least a central section of the pad 18.

An insulating layer 20 may be formed on the passivation films 14 and 16 on the semiconductor wafer 10. The insulating layer 20 may consist of either a plurality of layers or a single layer. The insulating layer 20 may have a stress relief function. The insulating layer 20 may be formed of a resin such as a polyimide resin, silicone-modified polyimide resin, epoxy resin, silicone-modified epoxy resin, benzocyclobutene (BCB), or polybenzoxazole (PBO). The insulating layer 20 may be formed to avoid a first region (cutting region) 32.

In this embodiment, a wiring pattern 22 is formed on the semiconductor wafer 10 as shown in FIG. 1A. The wiring pattern 22 may extend from the pad 18 and pass over the insulating layer 20. The wiring pattern 22 can be formed as follows, for example. A single layer or multilayer conductive film 24 is formed on the semiconductor wafer 10. For example, the conductive film 24 is formed of a titanium tungsten (TiW) film and a copper (Cu) film formed on the TiW film. The conductive film 24 may be formed by sputtering. The conductive film 24 may be formed at least in a region in which the wiring pattern 22 is formed, or over the entire surface of the semiconductor wafer 10 on which the pad 18 is formed. A plating resist layer (not shown) is then formed on the conductive film 24 so as to avoid the region in which the wiring pattern 22 is formed. The plating resist layer formed on the conductive film 24 may be patterned after a photolithography or the like. The wiring pattern 22 is then formed in an opening in the plating resist layer on the conductive film 24 by electroplating using the conductive film 24 as an electrode. Alternatively, the wiring pattern 22 may be formed by electroless plating.

Figure 1B:
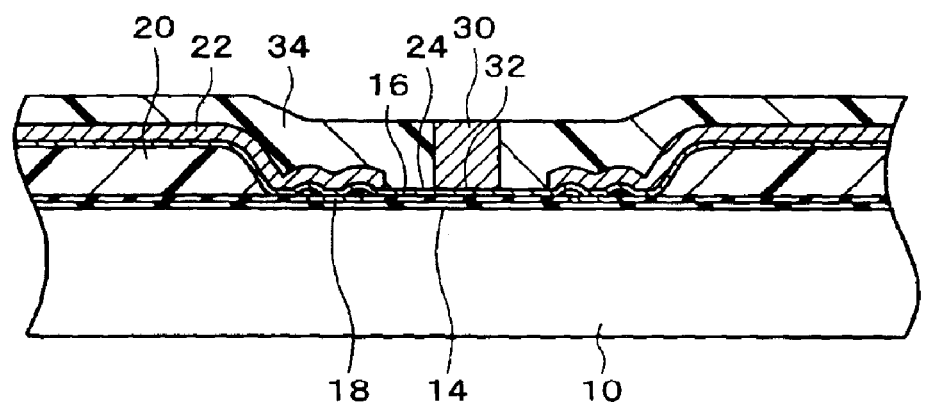

As shown in FIG. 1B, a non-resin layer 30 is formed on the semiconductor wafer 10. The non-resin layer 30 is formed of a material other than a resin (a metal such as copper, solder, or $SiO_2$, for example). The material for the non-resin layer 30 may have a spreading property lower than that of the material for the insulating layer 20. This ensures that a blade 50 (see FIG. 6) for cutting the semiconductor wafer 10 rarely clogs. The material for the non-resin layer 30 may have an etching rate differing from that of the material for the insulating layer 20. In the case of removing the non-resin layer 30 by etching, for example, the material of the non-resin layer 30 may have an etching rate higher than that of the material for the insulating layer 20. In this case, since the non-resin layer 30 can be easily removed from the semiconductor wafer 10, clogging hardly occurs in the blade 50 for cutting the semiconductor wafer 10. The non-resin layer 30 is formed in the first region 32. The first region 32 is a cutting (dicing, for example) region of the semiconductor wafer 10 and is in the shape of a lattice, for example. In the case of forming the insulating layer (stress relief layer) 20, the non-resin layer 30 may be formed to be located higher than the insulating layer 20. The non-resin layer 30 may be formed so as not to come in contact with the wiring pattern 22, or there may be an interval between the non-resin layer 30 and the wiring pattern 22.

The non-resin layer 30 may be formed by electroplating. For example, a plating resist layer 34 may be formed on the semiconductor wafer 10 so as to avoid the first region 32, and the non-resin layer 30 may be formed in an opening in the plating resist layer 34, that is, in the first region 32 by electroplating using the conductive film 24 as an electrode. Alternatively, the non-resin layer 30 may be formed by electroless plating, or by supplying droplets of a solvent containing fine particles of a conductive material (a metal such as gold, silver, or copper, for example). An ink-jet method or a Bubble Jet method may be used. As a solvent containing fine particles of gold, "Perfect Gold" (manufactured by Vacuum Metallurgical Co., Ltd.) may be used. As a solvent containing fine particles of silver, "Perfect Silver" (manufactured by Vacuum Metallurgical Co., Ltd.) may be used. There are no specific limitations to the size of the fine particles. The fine particles used herein refer to particles which can be supplied together with a solvent.

Figure 1C:
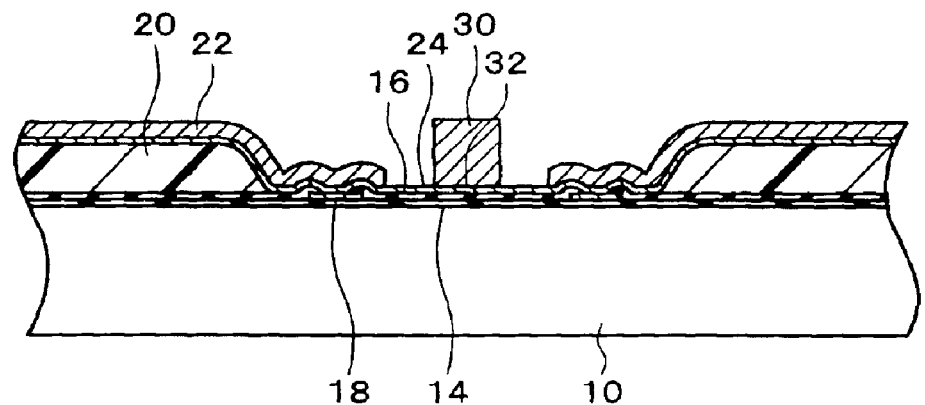
Figure 2A:
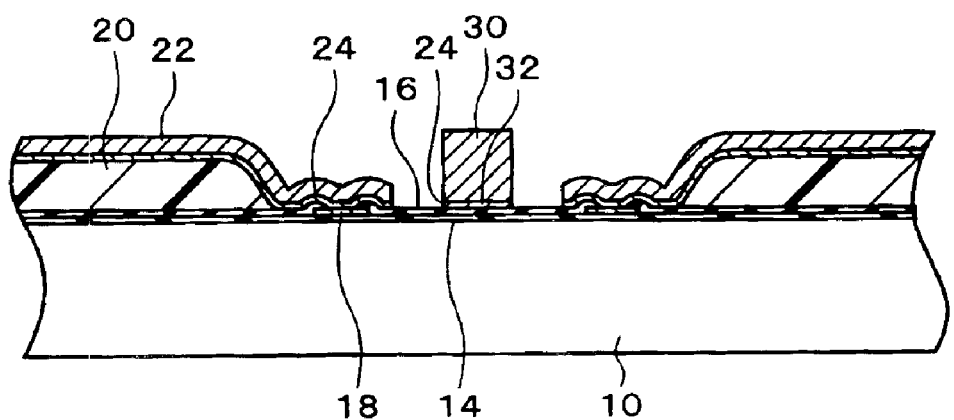
FIGS. 2A and 2B are diagrams for illustrating a method of manufacturing a semiconductor device according to the first embodiment of the present invention.

If the plating resist layer 34 is formed, the plating resist layer 34 is then removed as shown in FIG. 1C. If the wiring pattern 22 is electrically connected with the non-resin layer 30 through the conductive film 24, the conductive film 24 is patterned as shown in FIG. 2A. For example, the conductive film 24 may be etched by using the wiring pattern 22 and the non-resin layer 30 as masks.

Figure 2B:
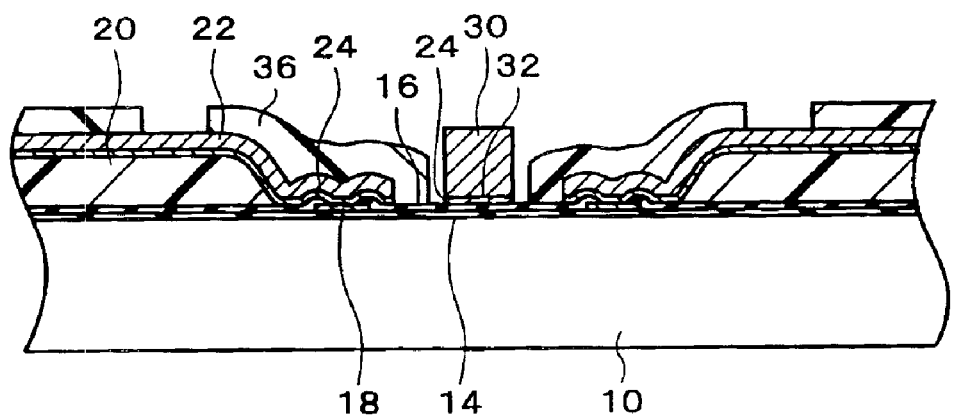

As shown in FIG. 2B, a solder resist layer 36 may be formed. The solder resist layer 36 is formed before forming a resin layer 40 as described later. For example, the solder resist layer 36 may be formed to cover the wiring pattern 22 excluding a region in which an external terminal 38 is formed (at least part of a land, for example). The solder resist layer 36 may be formed to avoid the first region 32. There may be an interval between the solder resist layer 36 and the first region 32.

Figure 3A:
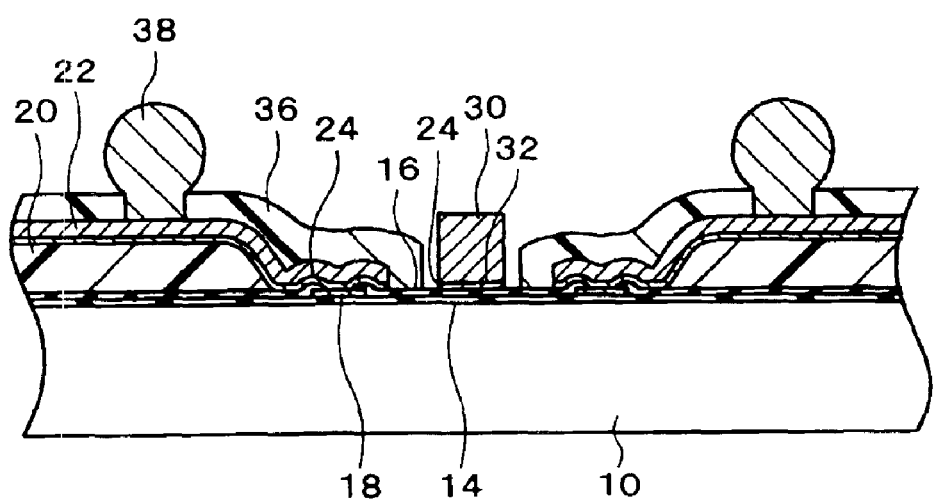
FIGS. 3A and 3B are diagrams for illustrating a method of manufacturing a semiconductor device according to the first embodiment of the present invention.

As shown in FIG. 3A, the external terminal 38 may be formed on the wiring pattern 22. The external terminal 38 may be formed of a filler metal (soldering material or brazing material). For example, the external terminal 38 may be a solder ball.

Figure 3B:
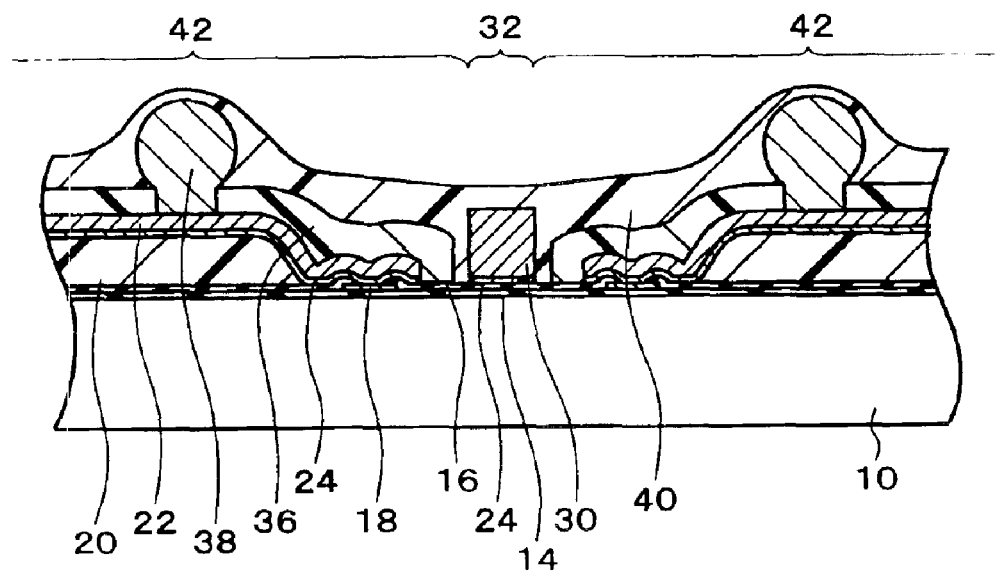

As shown in FIG. 3B, the resin layer 40 is formed. The resin layer 40 is formed in a second region 42 which is a region other than the first region (cutting region) 32. In this embodiment, the resin layer 40 is formed to cover the non-resin layer 30. Specifically, the resin layer 40 is formed above the first region 32, but on the non-resin layer 30. The resin layer 40 is formed also to cover the external terminal 38. Since the external terminal 38 projects upward, part of the resin layer 40 over the external terminal 38 is thin.

Figure 4A:
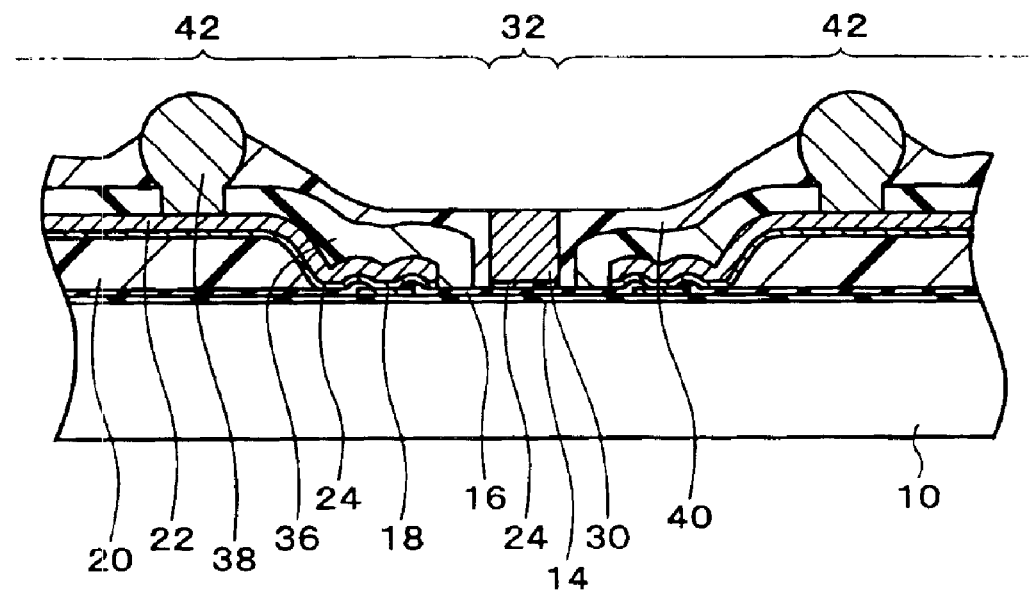
FIGS. 4A and 4B are diagrams for illustrating a method of manufacturing a semiconductor device according to the first embodiment of the present invention.

As shown in FIG. 4A, an upper portion of the resin layer 40 over the non-resin layer 30 (or at least part of the upper part) is then removed. In this removal, dry etching using plasma or the like may be applied. The resin layer 40 thus covers the second region 42, avoiding the first region 32.

A part (or an end, for example) of the external terminal 38 is exposed by removing an upper portion (or at least part of the upper portion) of the resin layer 40 over the external terminal 38. The removal of the upper portion of the resin layer 40 over the non-resin layer 30 and the removal of the upper portion of the resin layer 40 over the external terminal 38 may be performed simultaneously.

The resin layer 40 is thus patterned to surround at least a lower portion of the external terminal 38. This reduces thermal stress applied to the external terminal 38. Note that the resin layer 40 may be formed of a polyimide resin or the like, and that the coefficient of thermal expansion (or linear expansion) of the resin layer 40 may be greater than that of the insulating layer 20.

Figure 4B:
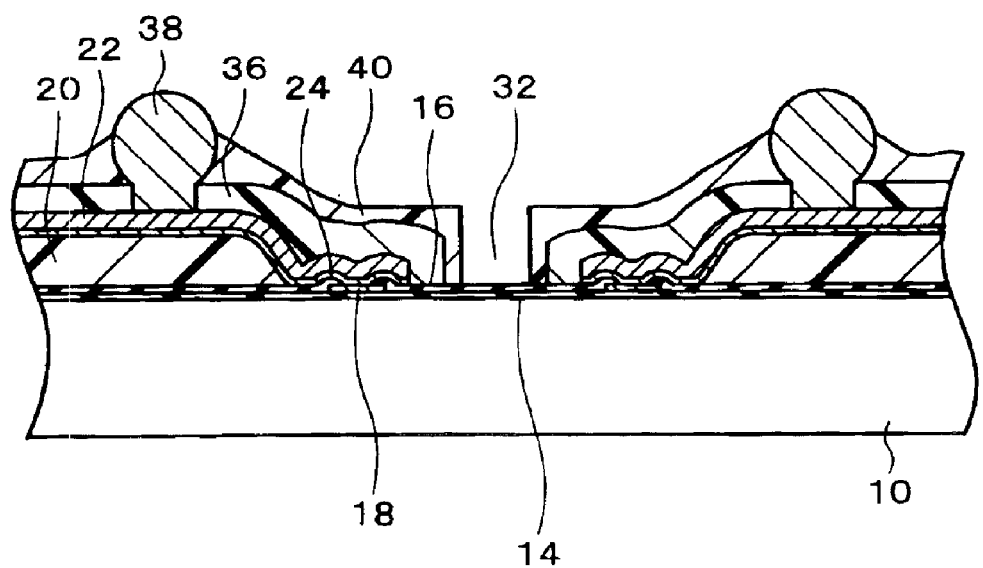

In this embodiment, the non-resin layer 30 is removed as shown in FIG. 4B. The non-resin layer 30 may be removed by wet etching. A solution for wet etching may contain ammonium persulfate or ferric chloride. The conductive film 24 under the non-resin layer 30 may be removed, or remain. The non-resin layer 30 is thus removed from the cutting (dicing) region. The resin layer 40 has already been removed from the non-resin layer 30. Note that the removal of the non-resin layer 30 is not required to be performed completely. Part of the non-resin layer 30 or a residue thereof may remain on condition that cutting (dicing) is not affected to a large extent.

Figure 5:
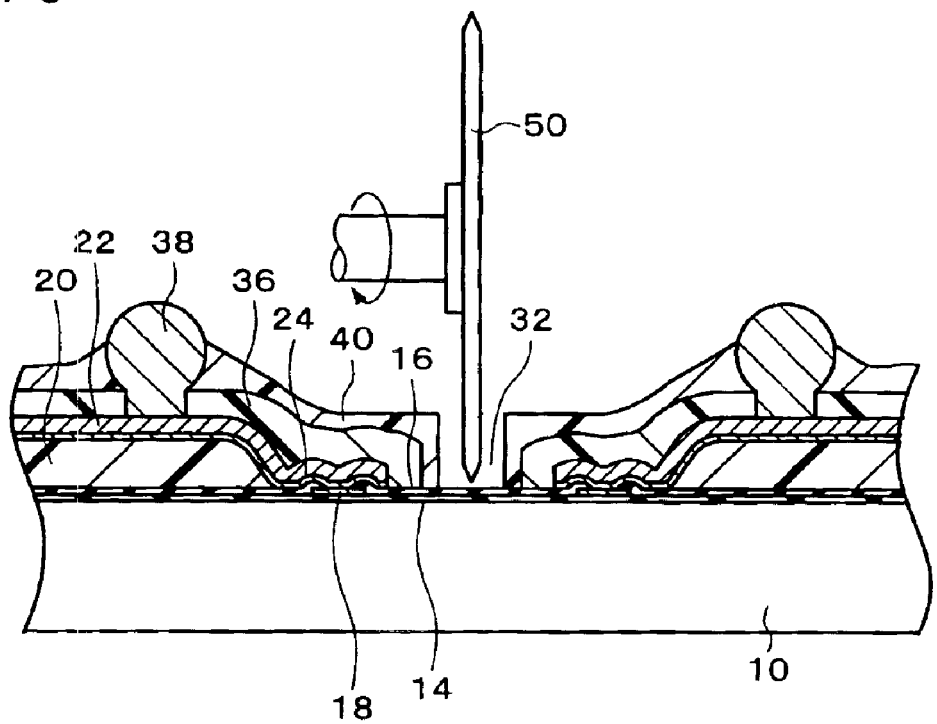
FIG. 5 is a diagram for illustrating a method of manufacturing a semiconductor device according to the first embodiment of the present invention.
Figure 6:
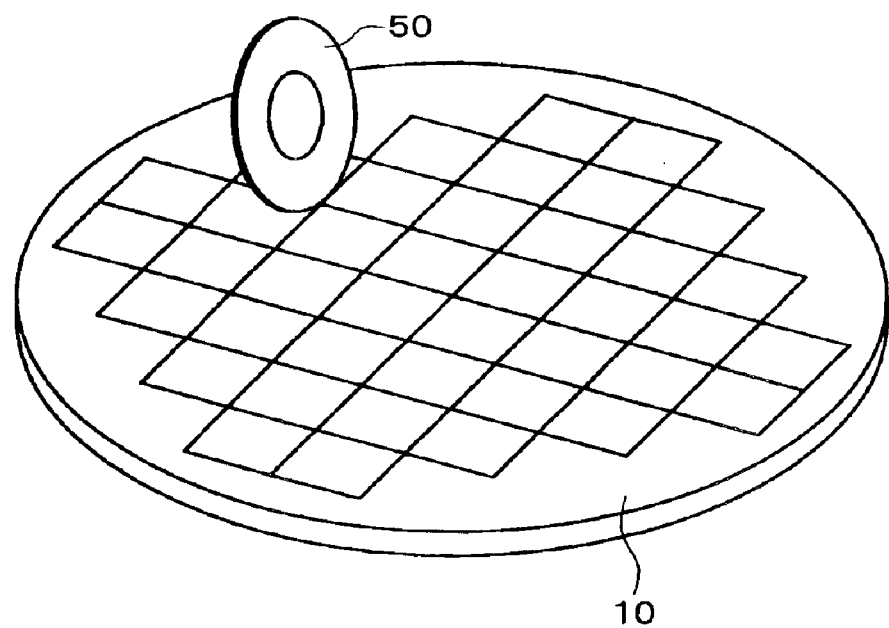
FIG. 6 is a diagram for illustrating a method of manufacturing a semiconductor device according to the first embodiment of the present invention.

As shown in FIGS. 5 and 6, the semiconductor wafer 10 is cut (or diced) along the first region 32. The blade 50 may be used for cutting. In this case, the semiconductor wafer 10 may be adhered to a tape or the like (not shown).

Since the resin layer 40 is not present in the first region 32 (cutting region), clogging rarely occurs in the blade 50, whereby breakage of the edge of the semiconductor chip can be prevented. Therefore, a highly reliable semiconductor device can be manufactured.

Figure 7:
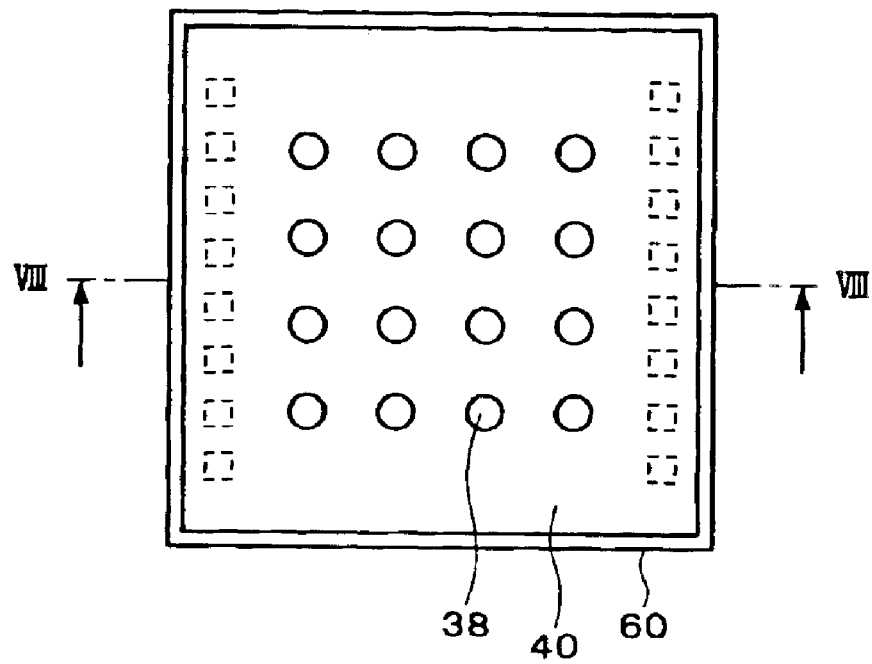
FIG. 7 is a diagram showing a semiconductor device according to the first embodiment of the present invention.
Figure 8:
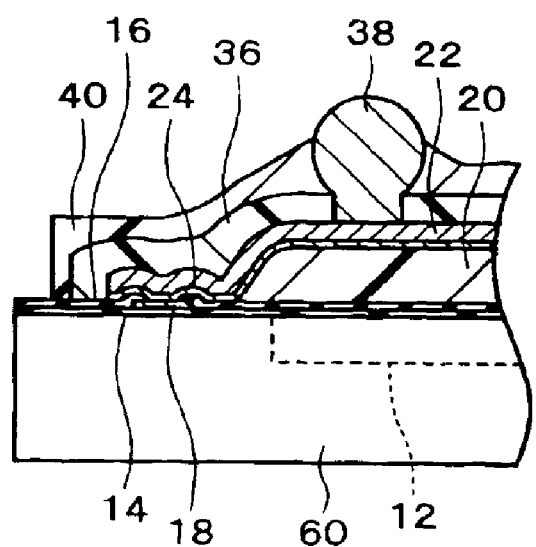
FIG. 8 is a partial cross-sectional view taken along the line VIII—VIII shown in FIG. 7.

FIG. 7 is a diagram showing a semiconductor device manufactured by the above-described steps. FIG. 8 is a partial cross-sectional view taken along the line VIII—VIII of FIG. 7. The semiconductor device includes a semiconductor chip 60. The semiconductor chip 60 is obtained by dicing the semiconductor wafer 10. Components formed in the above-described steps are provided on the semiconductor chip 60. The end of the resin layer 40 is located inside the edge of the semiconductor chip 60. The remainder can be derived from the above description and further description is omitted.

According to this embodiment, since the resin layer 40 is not present in the first region 32 when cutting the semiconductor wafer 10, the semiconductor wafer 10 can be cut very well. This prevents decrease in reliability.

Second Embodiment

Figure 9:
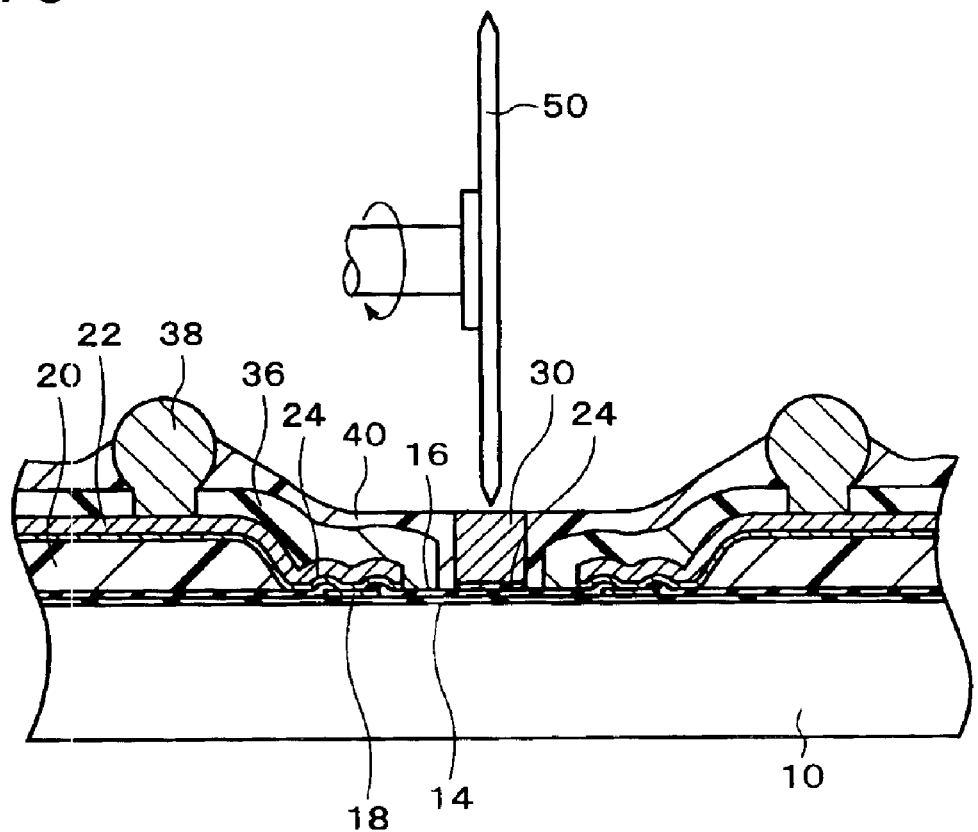
FIG. 9 is a diagram for illustrating a method of manufacturing a semiconductor device according to a second embodiment of the present invention.

FIG. 9 is a diagram for illustrating a method of manufacturing a semiconductor device according to a second embodiment of the present invention. In this embodiment, the semiconductor wafer 10 is cut together with the non-resin layer 30, differing from the step of FIG. 5. A material for this non-resin layer 30 may have a spreading property lower than that of the material for the insulating layer 20. In this case, since this non-resin layer 30 rarely causes clogging in the blade 50 in comparison with a resin, the semiconductor wafer 10 can be cut very well. Further details are the same as those described in the first embodiment.

Figure 10:
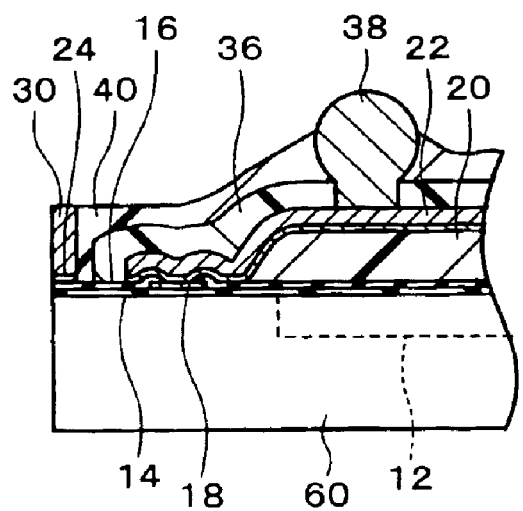
FIG. 10 is a diagram showing a semiconductor device according to the second embodiment of the present invention.

In a semiconductor device manufactured by the method according to this embodiment, the non-resin layer 30 is formed on the edge of the semiconductor chip 60 as shown in FIG. 10. The resin layer 40 is formed adjacent to the non-resin layer 30. If the non-resin layer 30 is a conductor, the non-resin layer 30 may be electrically connected with the outside. If the non-resin layer 30 is formed of a material having a high heat sink property such as a metal, the heat sink property of the semiconductor device can be improved. Further details are the same as those described in the first embodiment.

Figure 11:
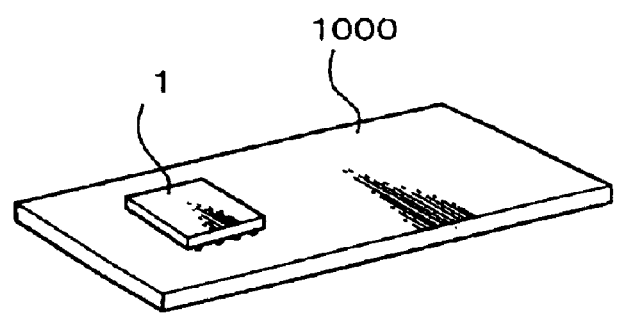
FIG. 11 is a diagram showing a circuit board on which is mounted a semiconductor device according to one embodiment of the present invention.

FIG. 11 shows a circuit board 1000 on which is mounted a semiconductor device 1 according to one embodiment of the present invention. An organic substrate such as a glass epoxy substrate is generally used as the circuit board 1000. An interconnect pattern is formed of copper or the like on the circuit board 1000 so as to form a desired circuit. The interconnect pattern is electrically connected to the semiconductor 1 by mechanically connecting the interconnect pattern and the external terminal 38 of the semiconductor device 1.

Figure 12:
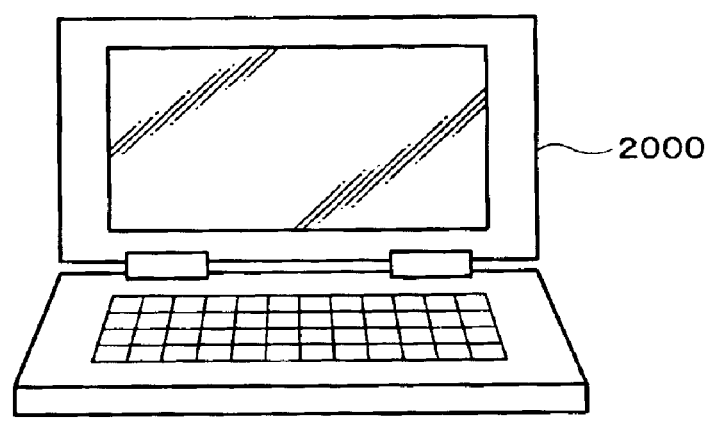
FIG. 12 is a diagram showing an electronic instrument having a semiconductor device according to one embodiment of the present invention.
Figure 13:
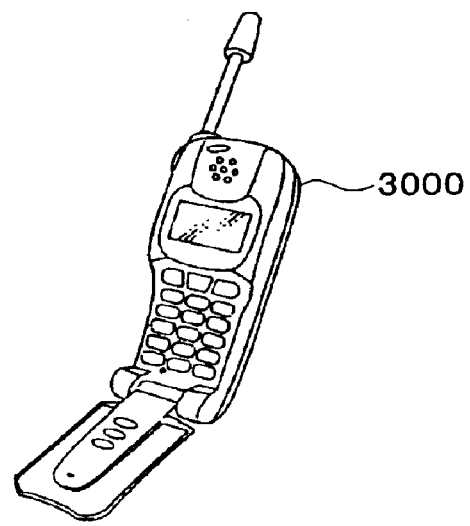
FIG. 13 is a diagram showing another electronic instrument having a semiconductor device according to one embodiment of the present invention.

FIGS. 12 and 13 show a notebook-type personal computer 2000 and a portable telephone 3000 as examples of the electronic instrument having the semiconductor device 1 to which the present invention is applied.

What is claimed is:

1. A method of manufacturing a semiconductor device comprising:

forming a wiring pattern over a semiconductor wafer and forming an external terminal on the wiring pattern, the wiring pattern extending from a pad which is part of an interconnect to an integrated circuit formed in the semiconductor wafer;

forming a non-resin layer of a non-resin material in a first region of the semiconductor wafer;

forming a resin layer in a second region which is a region of the semiconductor wafer other than the first region by utilizing the non-resin layer; and cutting the semiconductor wafer along the first region.

2. The method of manufacturing a semiconductor device as defined in claim 1, wherein the non-resin layer is formed of a material having a different etching rate from a material of the resin layer in the formation of the non-resin layer.

3. The method of manufacturing a semiconductor device as defined in claim 1, further comprising:

etching the non-resin layer after the formation of the resin layer and before the cutting of the semiconductor wafer, wherein the non-resin layer is formed of a material having a higher etching rate in the etching of the non-resin layer than a material of the resin layer in the formation of the non-resin layer.

4. The method of manufacturing a semiconductor device as defined in claim 1, wherein the non-resin layer is formed of a material having a lower spreading property than a material of the resin layer in the formation of the non-resin layer.

5. The method of manufacturing a semiconductor device as defined in claim 1, wherein the semiconductor wafer is cut after removing the non-resin layer.

6. The method of manufacturing a semiconductor device as defined in claim 1, wherein the non-resin layer is cut together with the semiconductor wafer.

7. The method of manufacturing a semiconductor device as defined in claim 1, wherein the non-resin layer is formed of a metal.

8. The method of manufacturing a semiconductor device as defined in claim 7, wherein the non-resin layer is formed by plating.

9. The method of manufacturing a semiconductor device as defined in claim 1, further comprising:

forming the resin layer to cover the non-resin layer; and removing at least part of the resin layer located over the non-resin layer before cutting the semiconductor wafer.

10. The method of manufacturing a semiconductor device as defined in claim 1, further comprising:

forming the resin layer to cover the external terminal; and removing at least part of the resin layer located over the external terminal.

11. The method of manufacturing a semiconductor device as defined in claim 9, further comprising:

forming the resin layer to cover the external terminal; and removing at least part of the resin layer located over the external terminal.

12. The method of manufacturing a semiconductor device as defined in claim 11, wherein the removal of at least part of the resin layer located over the non-resin layer and the removal of at least part of the resin layer located over the external terminal are simultaneously performed.

13. The method of manufacturing a semiconductor device as defined in claim 1, wherein an insulating layer is formed over the semiconductor wafer, and the wiring pattern is formed over the insulating layer.

14. The method of manufacturing a semiconductor device as defined in claim 13, wherein the non-resin layer is formed to be higher than the insulating layer.

15. The method of manufacturing a semiconductor device as defined in claim 13, wherein the insulating layer is formed to avoid the first region.

16. The method of manufacturing a semiconductor device as defined in claim 1, further comprising:

forming a solder resist layer so as to cover the wiring pattern excluding a region in which the external terminal is formed, before forming the resin layer.

17. The method of manufacturing a semiconductor device as defined in claim 16, wherein the solder resist layer is formed to avoid the first region.

18. A semiconductor device manufactured by the method as defined in claim 1.

19. A circuit board on which is mounted the semiconductor device as defined in claim 18.

20. An electronic instrument comprising the semiconductor device as defined in claim 18.

* * * * *